United States Patent [19]

Lee

[11] Patent Number: 4,610,000

[45] Date of Patent: Sep. 2, 1986

[54] ROM/RAM/ROM PATCH MEMORY CIRCUIT

[75] Inventor: Robert D. Lee, Denton, Tex.

[73] Assignee: Thomson Components-Mostek Corporation, Carrollton, Tex.

[21] Appl. No.: 663,926

[22] Filed: Oct. 23, 1984

[51] Int. Cl.⁴ .............................................. G11C 11/40
[52] U.S. Cl. ................................... 365/189; 365/104; 364/200
[58] Field of Search ................. 365/104, 94, 189, 200, 365/230; 364/200

[56] References Cited

U.S. PATENT DOCUMENTS

| 4,141,068 | 2/1979 | Mager et al. | 364/200 |
| 4,319,343 | 3/1982 | Powell | 365/189 |
| 4,542,453 | 9/1985 | Patrick et al. | 364/200 |

Primary Examiner—Joseph A. Popek
Attorney, Agent, or Firm—Roland Plottel

[57] ABSTRACT

An integrated circuit contains ROM, ROM patch and RAM memories on a common substrate with a standard pinout. The ROM and RAM fill the address space allowed by the address pins. Control of the patch memory without the use of special control pins is accomplished by writing to a ROM address with the standard control pins set for a RAM write. Various control functions are made of a series of standard-cycle read and write operations.

8 Claims, 5 Drawing Figures

ROM/RAM/ROM PATCH MEMORY CIRCUIT

TECHNICAL FIELD

The field of the invention is that of integrated circuit memories, in particular nonvolatile memories.

BACKGROUND ART

The use of a nonvolatile memory in which data is preserved by means of a back-up battery is disclosed in U.S. Pat. No. 4,451,742. The use of a ROM patch in order to correct for errors in a ROM is also known. The ROM patch includes circuitry which recognizes a particular ROM address and disables the old data, substituting corrected data on the output pins. One example of the use of a ROM patch is given in U.S. Pat. No. 4,319,343.

The prior art ROM patch circuits experience difficulty in making the patching process accessible to and convenient for the user—involving the use of dedicated pins in the integrated circuit or the need to interrupt the operation of the system in order to carry out a lengthly alteration process.

DISCLOSURE OF INVENTION

The invention relates to an integrated circuit memory system combining ROM, electrically erasable ROM patch and RAM on a single chip, in a single address space.

A feature of the invention is that the ROM patch functions may be performed without the use of special control pins or high voltages, but through the use of sequences of addresses within the ordinary address range.

Another feature of the invention is that the ROM may be patched and repatched so that errors may be corrected by an application system designer.

Another feature of the invention is that a ROM may be customized on short notice for a particular application.

Yet another feature of the invention is that the ROM may be customized in the field by the end user.

Yet another feature of the invention is that the patching process may be done in real time during system operation.

Yet another feature of the invention is that the system may read data while the patching process is taking place.

BEST MODE OF CARRYING OUT THE INVENTION

Figure 1:
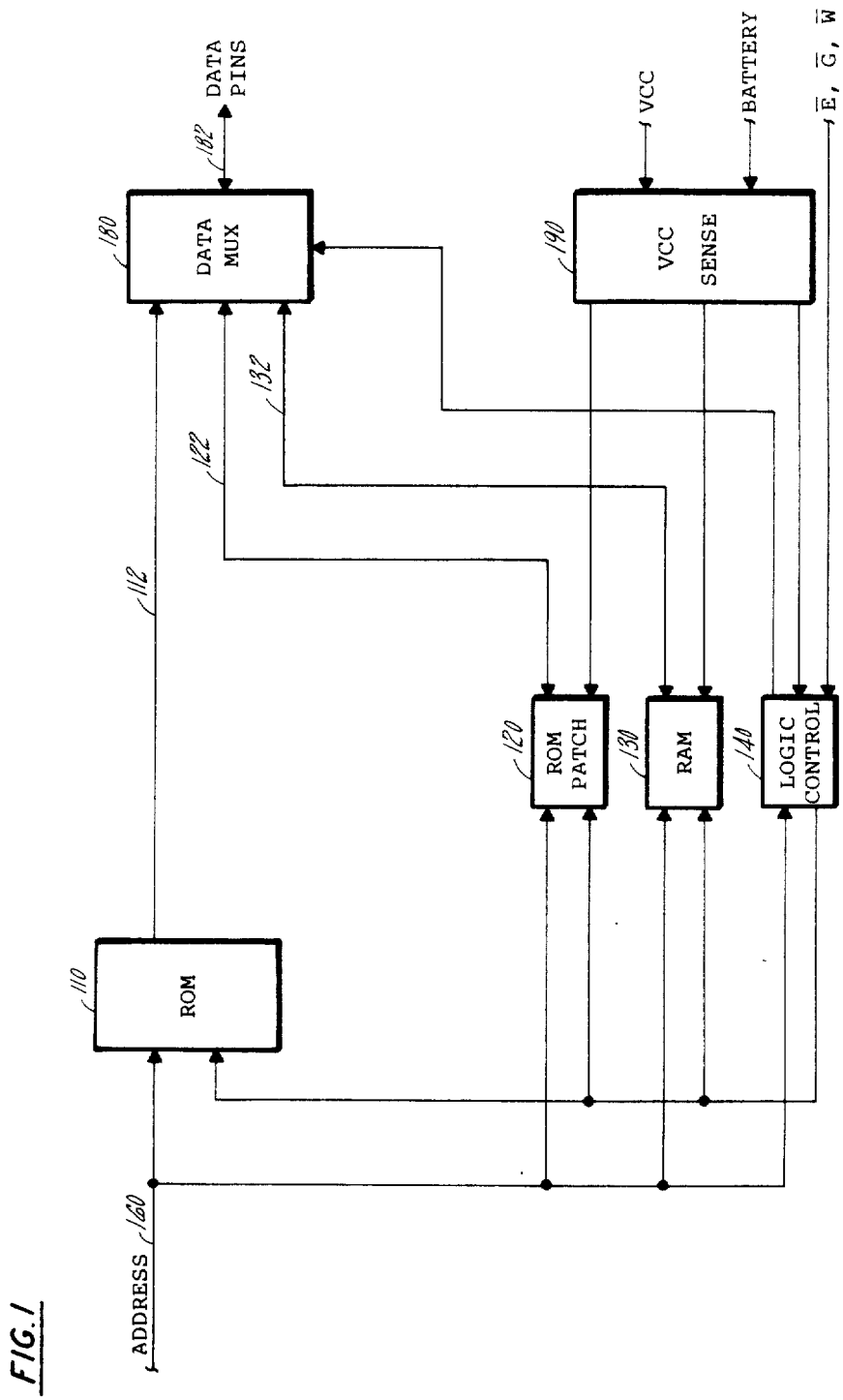
FIG. 1 illustrates a block diagram of an embodiment of the invention.

FIG. 1 illustrates a block diagram of an embodiment of the invention in which a memory address space of length 16,384 bytes is divided up into three separate portions comprising a ROM, RAM and ROM patch. The ROM illustratively has 15,872 bytes of data stored in a conventional ROM memory matrix that is organized on a byte-wide basis. The ROM memory cells may be formed by any convenient method known to those skilled in the art. The ROM may be patched or altered by means of block 120 which is an array of 256 bytes of static random access memory that may be altered and programmed as explained below. The remainder of the memory space is devoted to 512 bytes of nonvolatile RAM in block 130. The individual cells in blocks 120 and 130 are conventional CMOS static RAM cells such as is shown in Modern MOS Technology: Process, Devices and Design, DeWitt Ong, McGraw Hill, p. 265. Dynamic RAM memory circuits could also be used, with the added requirement of refreshing.

Control logic block 140 responds to control signals referred to conventionally as $\overline{E}$, $\overline{G}$ and $\overline{W}$ which are chip enable, output enable, and write enable signals respectively. The normal read operation from any of the blocks of memory and the write operation to RAM is conventional and will be described below.

In operation, for a normal read or write, control logic unit 140 responds to an address carried on the 14 lines of address bus 160 to decode the address conventionally and enable the proper memory cell. Data is transferred into or out from memory on the appropriate data line 112, 122, or 132. It may be noted that data line 112 is one way for the ROM, while data lines 122 and 132 are bidirectional, since the ROM patch and the RAM may be written to and read from. The three output lines converge on conventional data multiplexer 180 which forms the appropriate connection between data pins 182 and one of the data lines. Multiplexer 180 is responsive to a signal from control logic 140 to place a high impedance state on pins 182 or to form the appropriate low impedance connection.

Circuit 190 is an analog circuit that senses the voltage on VCC and, when VCC is not present, switches the battery to provide standby power for ROM patch 120 and RAM 130. This circuit is described in U.S. Pat. No. 4,451,742, issued to the assignee hereof, which is incorporated by reference.

As was described above, the function of ROM patch 120 is to correct for errors in ROM 110; to provide substitute values for the ROM to customize the circuit for a particular application; or for any other purpose by suppressing the output of the data stored in a particular byte in ROM 110 and substituting for that data new data that has previously been stored within patch 120. The decoding system and suppression of the output from ROM 110 are conventional and any number of circuits may be used to produce the result. A suitable example is illustrated in U.S. Pat. No. 4,319,343. The function of RAM 130 is to store any convenient data, such as data being generated during circuit operation or data which may be programmed into RAM 130 when the circuit is incorporated within a system. The fact that RAM 130 is nonvolatile gives the greatest degree of flexibility to the system designer. All or a portion of RAM 130 may be used for data which is programmed when the system is first put together or may be used for temporary storage of data which is generated during system operation.

The combined memory space offers the greatest degree of flexibility to the system designer. ROM is used for the maximum density storage while the static RAM is preferably used for temporary storage of data. The availability of a ROM patch permits correction for some processing errors that result in invalid data in some memory cell. A defective ROM may be salvaged in this way by patching the defective byte, just as coding errors may be corrected. The particular division of the memory address space into the three different components is, of course, subject to variation in any particular case. It has been found by experience that about 5% of ROM is subject to correction when a system is finally debugged and that is a suitable amount of space to reserve for ROM patch 120.

If there were an unlimited number of pins available on integrated circuits, it would be simple to implement the memory of FIG. 1 by adding special control pins to control the sequence of patching the ROM, as well as separate storage registers to store and keep track of the amount of ROM that has been patched. In the real world, however, the pinout of the integrated circuit must correspond to conventional standards in order to make the system commercially viable. The implementation of special functions within a conventional pinout arrangement gives rise to nontrivial problems.

In a particular embodiment of the invention, the total address space of memory is 133,120 bits placed in a byte-wide arrangement and using the standard 28 pin JEDEC byte-wide pinout. The available control signals are thus confined by the standard to $\overline{E}$, $\overline{G}$ and $\overline{W}$ so that no pins are available for a special ROM patch enable signal. Table I illustrates different modes of operation together with the required signals on the three control pins and the status of the address pins and data pins. The first four rows of this table are conventional. The ROM patch mode, controlled when $\overline{E}$ is low and $\overline{W}$ is low, incorporates several functions as described below. Note that the control pin configuration for ROM patch is not unique, being the same as the write RAM configuration.

Whether special function pins are available or not, it is important to make the programming operation compatible with the ordinary operation of the system in which the memory circuit is to be used; i.e. to make use of signals and sequences of signals that do not require a great deal of extra circuitry within the system. Nonvolatile integrated circuits that employ tunnel-oxide memory cells require a long programming time that, in turn, requires special configuration of the overall system in order to accomodate the disabling of a memory chip for the long period of time that it takes to store data.

In the embodiment described herein, it is possible to perform all the functions of patching the ROM, checking the status of the ROM patch and clearing the ROM patch by means of a series of ordinary read and write operations each of which takes a standard read or write time.

Figure 2:
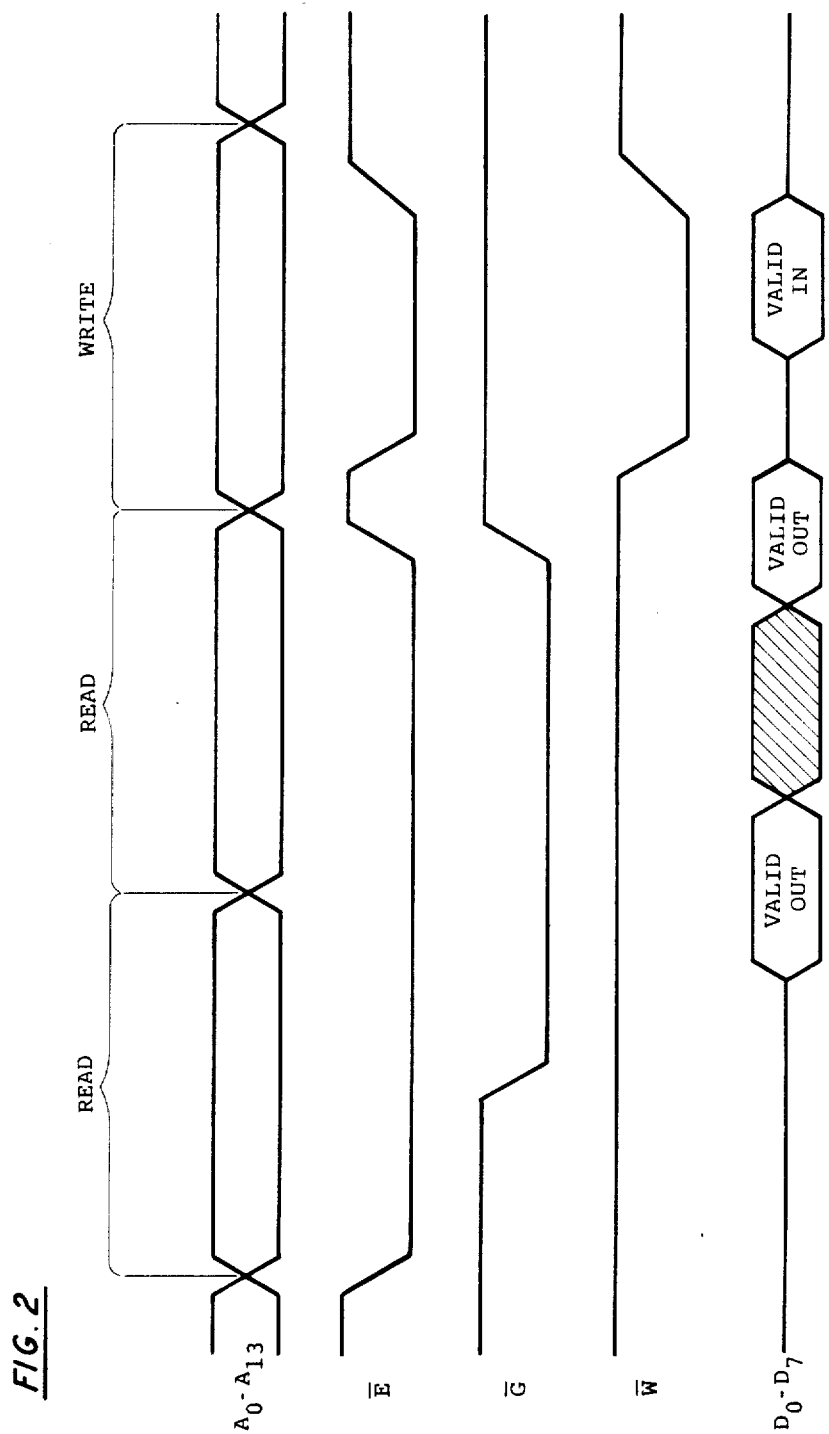
FIG. 2 illustrates a timing cycle of a conventional read and write operation.

Referring now to FIG. 2, a timing sequence is shown for a series of two read cycles followed by a write cycle. The data on address inputs $A_0$ to $A_{13}$ are illustrated on the top line. The control signals $\overline{E}$, $\overline{G}$, $\overline{W}$ are illustrated for the read and write operations. The bottom line shows the state of the the bidirectional data pins $D_0$–$D_7$. This timing sequence is purely conventional, an evident advantage in utilizing the chip. This timing sequence of control signals will be referred to as a standard RAM write sequence, i.e. standard for this system. Other systems with different control pins may have a different standard RAM write sequence. As will be explained in connection with FIG. 3, the subject invention uses a combination of the standard RAM write sequence together with a ROM address to perform various control functions.

In patch mode, four functions may be performed: write patch, read patch status enter, read patch status exit, and clear patch. Each of these four functions is initiated by a sequence of two dummy writes to two security addresses in the ROM section of memory space that, in this embodiment, are hexadecimal 3DFA and 3DF7. This dummy write operation is done in order to provide security and to avoid the problem of accidently altering the ROM. The address decoding circuitry recognizes these two addresses and inhibits any write operation.

The double write operation serves as a substitute for a special function pin. In order to use a memory address as a function indicator, however, it is necessary to make some special provision so that data can still be written into the address. This has been done by requiring that the ROM be patched only in units of four bytes. The 256 bytes of ROM patch 120 have been divided into 64 blocks. Each block is identified by a 14 bit binary address, the least two significant bits of which are 00. The requirement that four bytes in succession be modified at any one time thus frees up the next three addresses to be used as control signals. The sequence of write signals is discussed below, in connection with FIG. 3.

In the illustrative embodiment, the highest block in ROM is used for three of the signal addresses. Block 3967 consists of the four addresses 3DFC, 3DFD, 3DFE, and 3DFF, of which 3DFC is reserved as the indicating address of the block and the remaining three are available as control signals. In this case, the address 3DFD is used for the read patch status enter signal; 3DFE is used for the read patch status exit signal and the remaining address 3DFF is used for the clear patch signal. In the preceding blocks 3966 and 3965, security addresses one and two are, respectively, 3DFA and 3DF7.

The clear patch function is self-explanatory. It clears the ROM patch 120, removing all patches that have been made, altering the signal flags and erasing the stored data. The implementation steps to step through the RAM block 120 and the registers are conventional. The read patch status enter and exit functions enter a mode in which an internal patch status register (to be described below) is output by switching the two bytes of the patch status register with the contents of RAM address locations 3FFE and 3FFF. These two RAM address locations are read out making the contents of the patch status register available. At the end of the cycle, the data which were previously stored in those RAM address locations are replaced. With this approach, it is possible to perform the alterations on the ROM patch by means of ordinary write and read cycles as will be described below.

Figure 3:
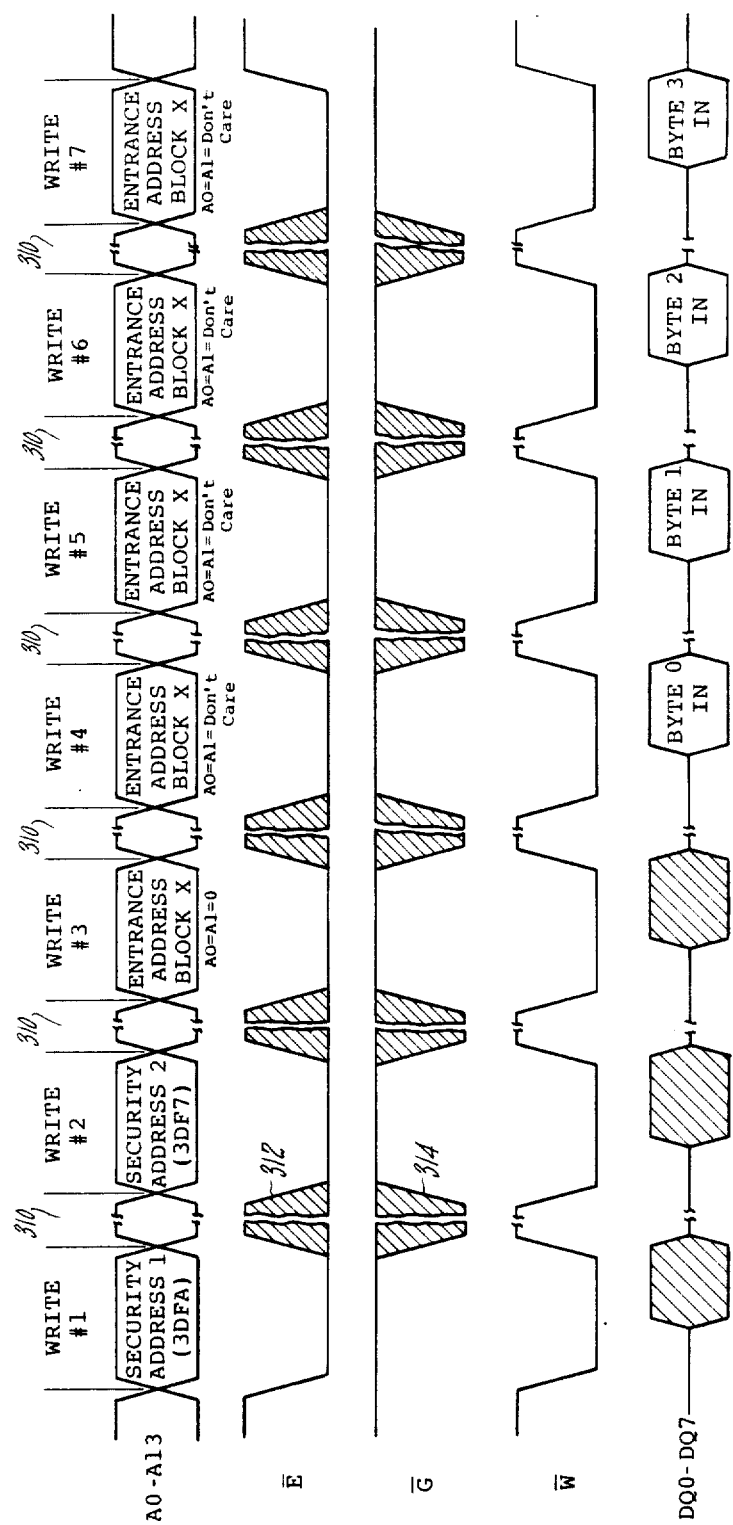
FIG. 3 illustrates a timing sequence of a special cycle to write a ROM patch.

Referring now to FIG. 3, a write patch sequence is illustrated in which a block of four bytes will be replaced. First, write number one is done by writing to security address number one. As is indicated by the diagonal lines in the data row at the bottom of the figure, the data pins during this write operation are a "don't care" because the decoding circuitry within control logic unit 140 recognizes security address one as a dummy write operation. In the next time block, indicated by the numeral 310, it is possible to have any number of ROM or RAM reads so that the system operation may proceed unhindered. Next, write number two consists of a write operation to security address number two. Similarly, the data lines are "don't care" during this operation, just as in the case of write number one. A second slot 310 is available for ROM and RAM reads. Write number three enters in the address of the first byte of block X, the block to be replaced. As mentioned above, the two lowest order bits of the block address are 0 and 0. The next four write operations —4, 5, 6 and 7 are sequentially the replacement of the four bytes of data in the block in question. Conventional circuitry within logic unit 140 alters the decoding step to enable the corresponding ROM patch-block instead of the ROM when an address within the four-byte block is input. In the present invention, an array of 64 memory registers stores the upper 12 bits of the binary address of the first cell in a patch block. A set of exclusive or circuits is connected between the cells of the registers and the corresponding lines on the address bus. When any address within a patched block is on the bus, the set of exclusive—or circuits generates a signal to inhibit the ROM output and to enable the patch ROM byte that is identified by the lower two bits on the address bus and the block that is identified with the upper 12 bits.

Note that any number of ROM or RAM reads may be interspersed with this write operation. It should be noted that if only one byte within a block is to be changed, then the remaining three bytes are simply copied back as they were. It should also be noted that, although the ROM must be patched in blocks of four, once the patching process is over any address within ROM 110 may be read in any order. There is no restriction on the ROM reading process after the patch has been made. Two advantages of this patching operation are that it does not require any long period of time in which the system is disabled (as is the case for the tunnel-oxide nonvolatile memories) and that it is essentially invisible to system operation since the system may be performing all the usual ROM and RAM reads during the patching operation.

Once one or more blocks of the ROM have been patched, it is important to keep track of which blocks of ROM patch 120 have been used. As an important convenience to the user, this information is stored within the chip in an internal patch status register consisting of two bytes. The least significant byte contains the six bit binary number of patches that have been used. The most significant byte contains four bits of information; one that is set high when all patches are in use, two bits that are used for battery status and a patch check bit (PCB). This bit is high if the last ROM address bit was patched and low otherwise. This function allows the customer to check that the patch he has just written has been properly entered. Also, the customer can write to a ROM address and then check the PCB to see if that ROM address has been patched.

Figure 4:
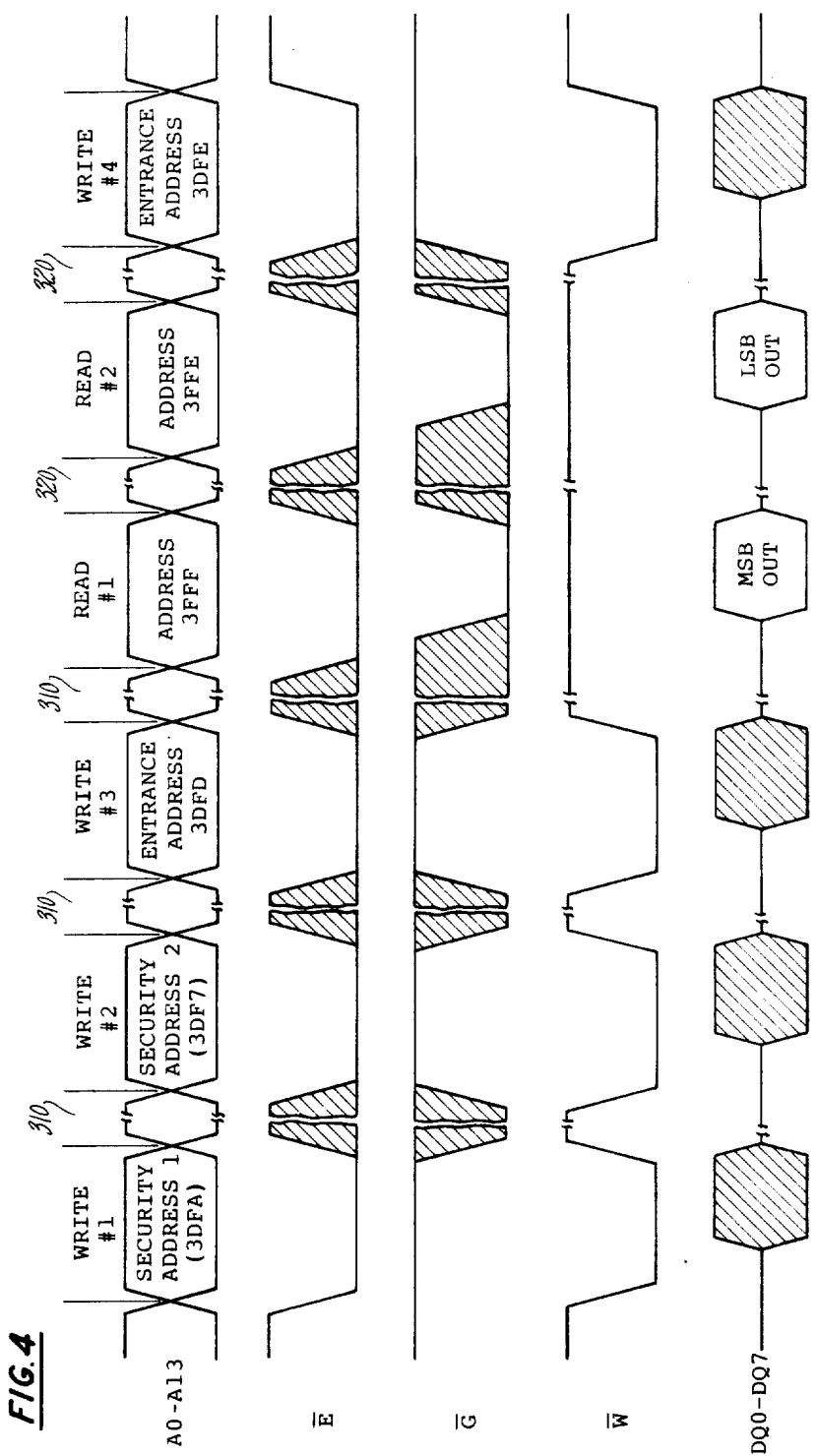
FIG. 4 illustrates a special cycle to read the patch status.

The use of the patch status register is illustrated in FIG. 4 in which the conventional write one and write two to security addresses are performed as described in connection with FIG. 3. A third dummy write to address 3DFD is performed which is the signal to swap the two bytes of patch status register to two fixed addresses. Two conventional RAM reads follow at those particular addresses listed in the box as read number one and read number two. The last signal is another dummy write to address 3DFE which causes the data to be swapped back so that the contents of addresses 3FFF and 3FFE are replaced in the RAM. Thus, it is possible to check the status of the register without the necessity of reserving two bytes in RAM for the register.

Figure 5:
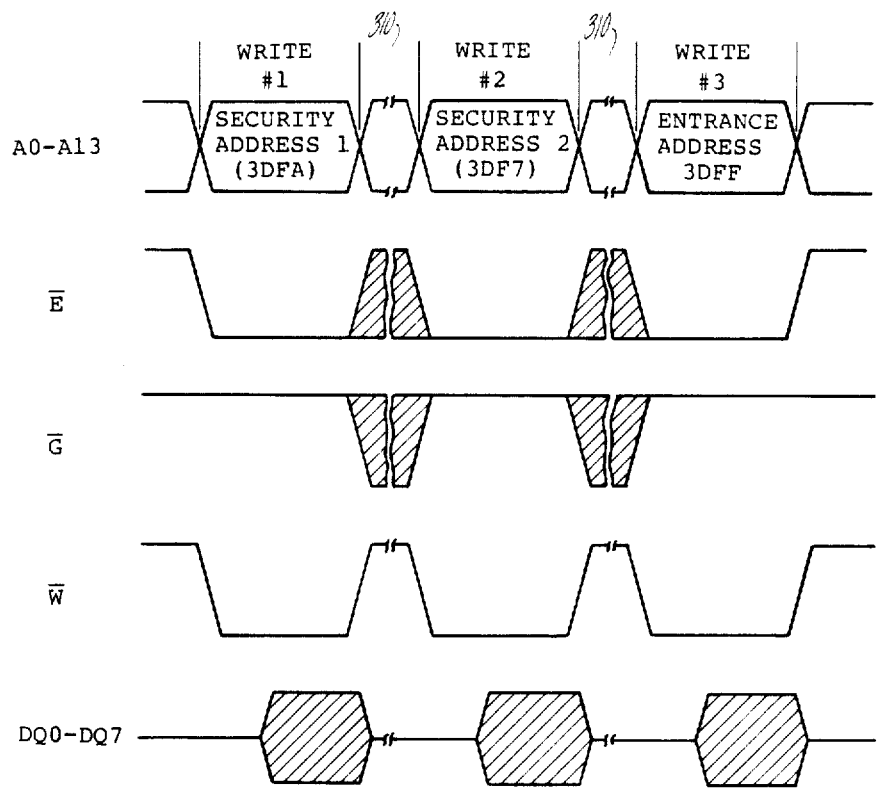
FIG. 5 illustrates a special cycle to clear the ROM patch.

The last patch mode operation is illustrated in FIG. 5, in which the conventional two dummy writes are performed followed by a third dummy write to address 3DFF. Conventional internal circuitry within logic block 140 receives this signal and proceeds to erase the contents of ROM patch 120 and to reset the patch status register.

Those skilled in the art will readily be able to devise alternative embodiments of the invention. In particular, it is not necessary that blocks of four bytes be used. A block of two bytes, eight bytes or any convenient number may be used. Further, it is not necessary that the memory be organized in terms of bytes and alternative architectures may also be used in connection with the invention.

The representation in FIG. 1 is schematic in nature and, as will be evident to those skilled in the art, the physical position of the conventional electronic circuits used to implement the logic functions is a matter of convenience. In particular, logic control unit 140 represents most of the memory overhead circuitry. Unit 140, for example, includes both the decoders that respond to input addresses and the execution logic that enables the ROM patch and the multiplexer. The address bus is shown as going directly to all three memory units, but the bus may physically enter only a decoding unit, with the ROM patch, for example, being connected only indirectly to the bus. The execution logic within logic unit 140 may be conventional microcode operations customary in control processing units. If it is convenient, any of a number of available central processing units could be used.

TABLE I

| E | G | W | RAM/ROM Address | Mode | Data |
|---|---|---|---|---|---|
| H | X | X | X | Deselect | High Z |
| L | H | H | X | Read | High Z |
| L | L | H | X | Read | $D_{out}$ |
| L | X | L | RAM | RAM Write | $D_{in}$ |
| L | X | L | ROM | Patch | Multi-function |

What is claimed:
1. An integrated circuit memory system comprising:
a read-only memory;
a patch-memory on a substrate common to said read-only memory for patching predetermined blocks of said read-only memory;
an input address bus connected to said read-only memory and said patch memory;
a control logic unit comprising decoding circuitry for enabling a predetermined portion of said patch memory in response to a predetermined address on said address bus; and
output means responsive to said predetermined address for connecting data from either said read-only memory or said patch memory to at least one input/output terminal, characterized in that:
said memory system further comprises a nonvolatile random-access memory, sharing a common address space with said read-only memory, said random access memory and said read-only memory combining to fill said address space;
each of said random-access memory and said patch-memory comprises an array of volatile memory cells;
said random-access memory is controlled by memory overhead circuitry, having a write control pin, for reading data out from and writing data into that portion of said array of volatile memory cells within a random-access portion of said common address space;

said patch-memory and said random-access memory are both connected to a voltage-maintenance circuit containing circuit means responsive to a power supply voltage and to at least one battery voltage for maintaining data in said patch-memory and said random-access memory when said power supply voltage is below a predetermined threshold, whereby data in said array of volatile memory cells is preserved during periods when said power supply voltage is low.

2. A memory system according to claim 1, further characterized in that said control logic unit includes circuit-enabling means responsive to a predetermined pattern of signals on said address bus for enabling selected portions of said control logic unit to open a path between said input/output terminal and at least one of said patch memory cells, whereby access to said patch memory cells may be controlled by said pattern of signals on said address bus.

3. A memory system according to claim 2, further characterized in that said predetermined pattern of signals comprises a pattern of signals representative of at least one predetermined address in said read-only memory and in that said memory overhead circuitry, including said write control pin, is controlled in a random-access write configuration to process a write operation to an address within said random-access memory, whereby said circuit-enabling means is responsive to the combination of an address within read-only memory and said random-access write configuration.

4. A method of manipulating data in a portion of a patch-ROM memory array within an integrated circuit memory system having ROM, RAM and patch-ROM memory arrays, said ROM and RAM having a ROM address range and a RAM address range, respectively, that combine to fill a system memory range, whereby said patch-ROM memory array does not have predetermined addresses within said system memory range, said integrated circuit having connection pins for control voltages within said system memory range, comprising the steps of:

setting predetermined control voltage states on system control pins and said states are not unique to said patch-ROM manipulation;

placing a first predetermined address within said ROM address range on a set of address lines as part of a first write sequence under control of said control voltage states; and placing an entrance address within said ROM address range on said address lines as part of a second write sequence under control of said control voltage states.

5. A method according to claim 4 in which:

said entrance address is the address of a first cell in a block of at least two cells with in said ROM address range; and including the further steps of consecutively setting a data value to be written into said first cell followed by data values to be written into succeeding ones of said block of cells on a data line connected to said block of at least two cells in response to said nonunique configuration of control pins and said entrance address within said ROM address range.

6. A method according to claim 4, in which said entrance address initiates an automatic sequence of steps manipulating said patch-ROM memory array.

7. A method according to claim 6, in which said patch-ROM memory array is automatically cleared.

8. A method of manipulating data in a portion of a patch-ROM memory array within an integrated circuit memory system having ROM, RAM and patch-ROM memory arrays, said ROM and RAM having a ROM address range and a RAM address range, respectively, that combine to fill a system memory range, whereby said patch-ROM memory array does not have predetermined addresses within said system memory range, in the operation of which system there is a standard RAM write sequence of operations for writing data into said RAM, said integrated circuit having control and address pins comprising the steps of:

setting predetermined control voltage states on system control pins and said states are not unique to said patch-ROM manipulating;

placing a first predetermined address within said ROM address range on a set of address pins as part of a first standard RAM write sequence; and placing an entrance address within said ROM address range on said address pins as part of a second standard RAM write sequence.

* * * * *